United States Patent [19]

Yamada

[11] Patent Number: 5,023,683
[45] Date of Patent: Jun. 11, 1991

[54] SEMICONDUCTOR MEMORY DEVICE WITH PILLAR-SHAPED INSULATING FILM

[75] Inventor: Takashi Yamada, Kanagawa, Japan

[73] Assignee: Kabushiki Kaisha Toshiba, Kawasaki, Japan

[21] Appl. No.: 404,878

[22] Filed: Sep. 8, 1989

[30] Foreign Application Priority Data

Sep. 30, 1988 [JP] Japan ................................ 63-246413

[51] Int. Cl.⁵ .................... H01L 29/68; H01L 29/06; H01L 27/02
[52] U.S. Cl. .................................... 357/23.6; 357/55; 357/56; 357/41
[58] Field of Search ...................... 357/23.6, 55, 41, 56

[56] References Cited

U.S. PATENT DOCUMENTS 4,785,337 11/1989 Kenney ............................ 357/23.6
4,855,801 8/1989 Kuesters ............................ 357/23.6

OTHER PUBLICATIONS

Technical Digest of Conference on Solid State Devices and Materials, pp. 581–584, "A Novel Storage Capacitance Enlargement Structure Using a Double-Stacked Storage Node in STC DRAM Cell", T. Kisu et al, 1988.

Primary Examiner—William Mintel
Assistant Examiner—R. Potter
Attorney, Agent, or Firm—Oblon, Spivak, McClelland, Maier & Neustadt

[57] ABSTRACT

A semiconductor memory device having an improved capacitor configuration is provided in which storage node electrodes are formed projecting perpendicularly with respect to a substrate. Thus, the surface areas of the storage node electrodes are enlarged. As a result, memory cell chip areas can be minimized while maintaining the prescribed capacitance of storage capacitors. Further, a method of manufacturing the device is also provided.

6 Claims, 29 Drawing Sheets

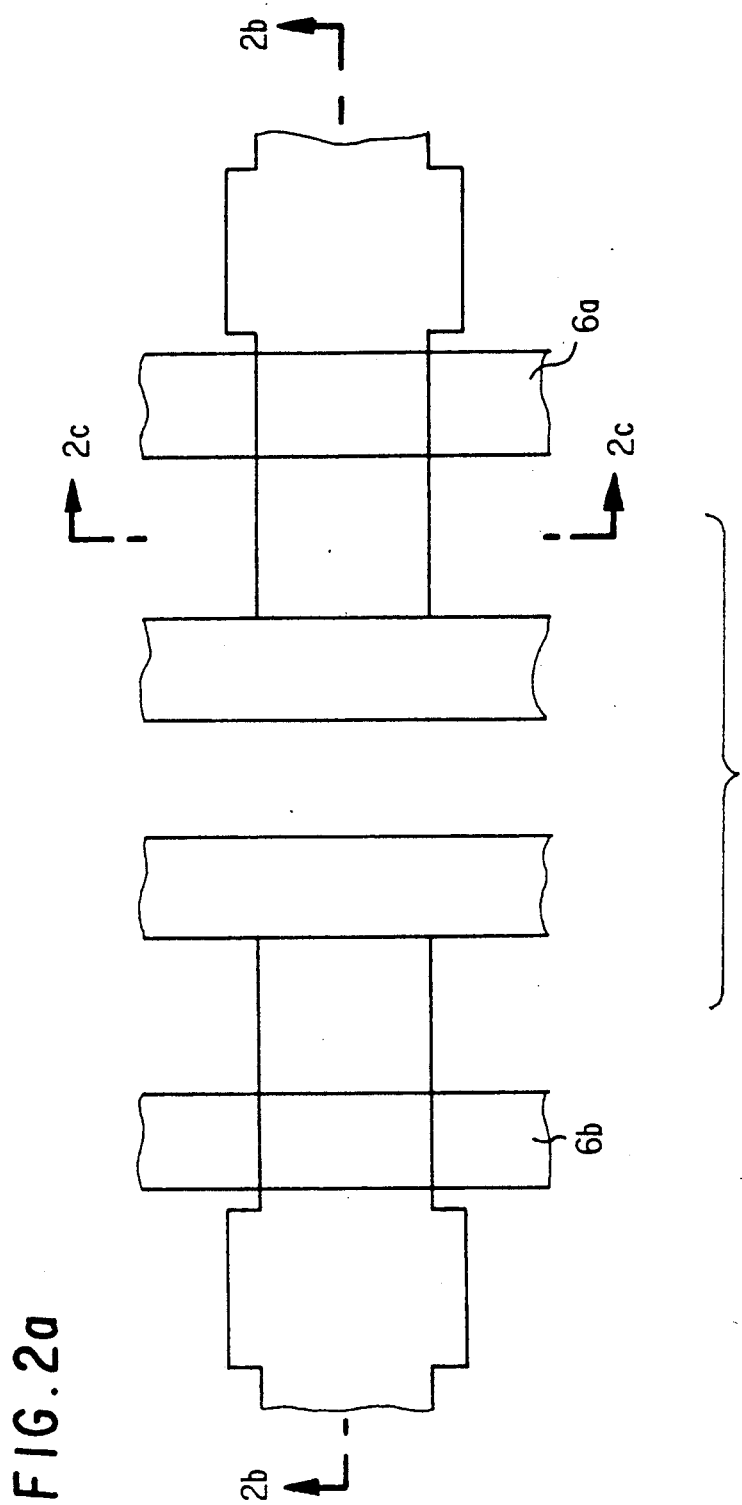

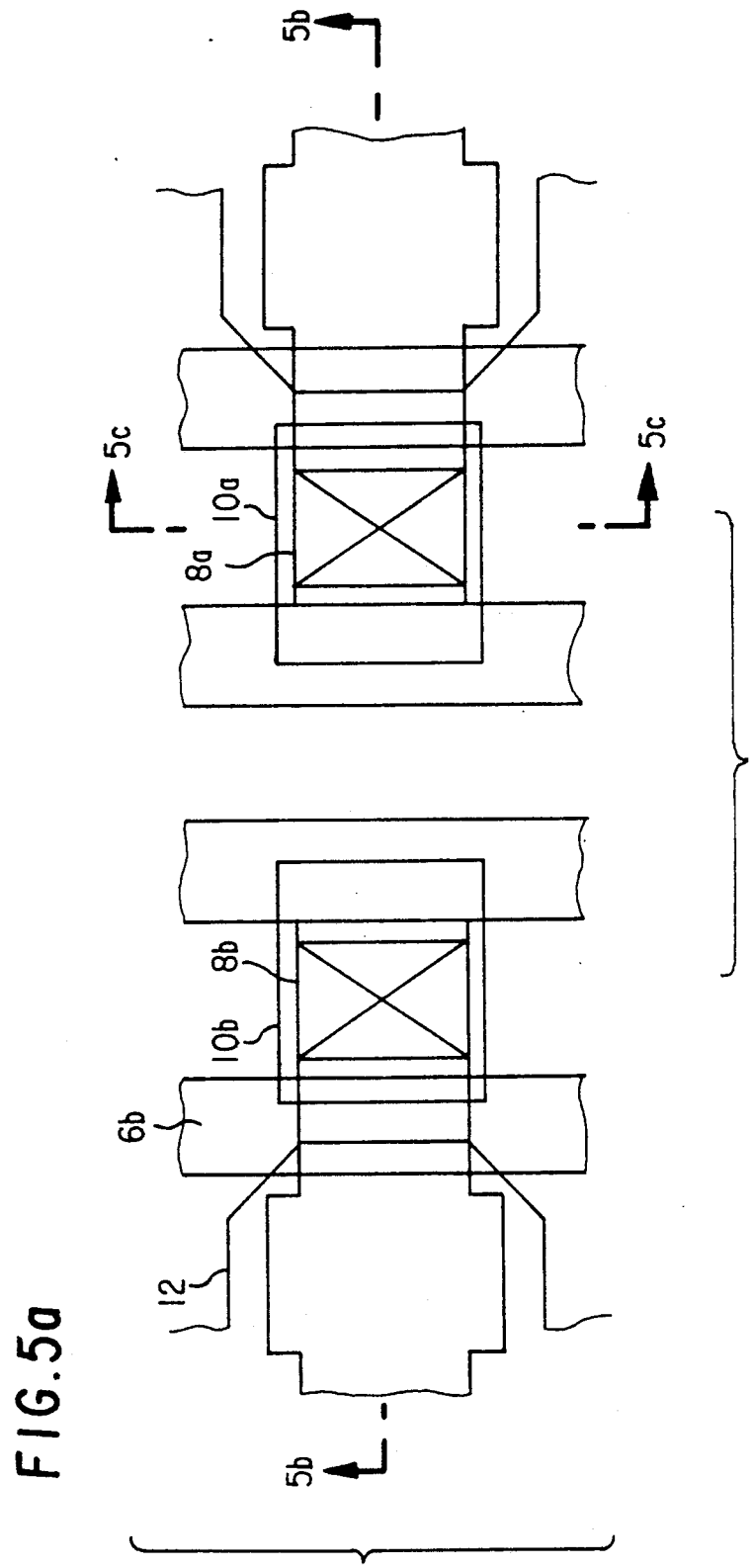

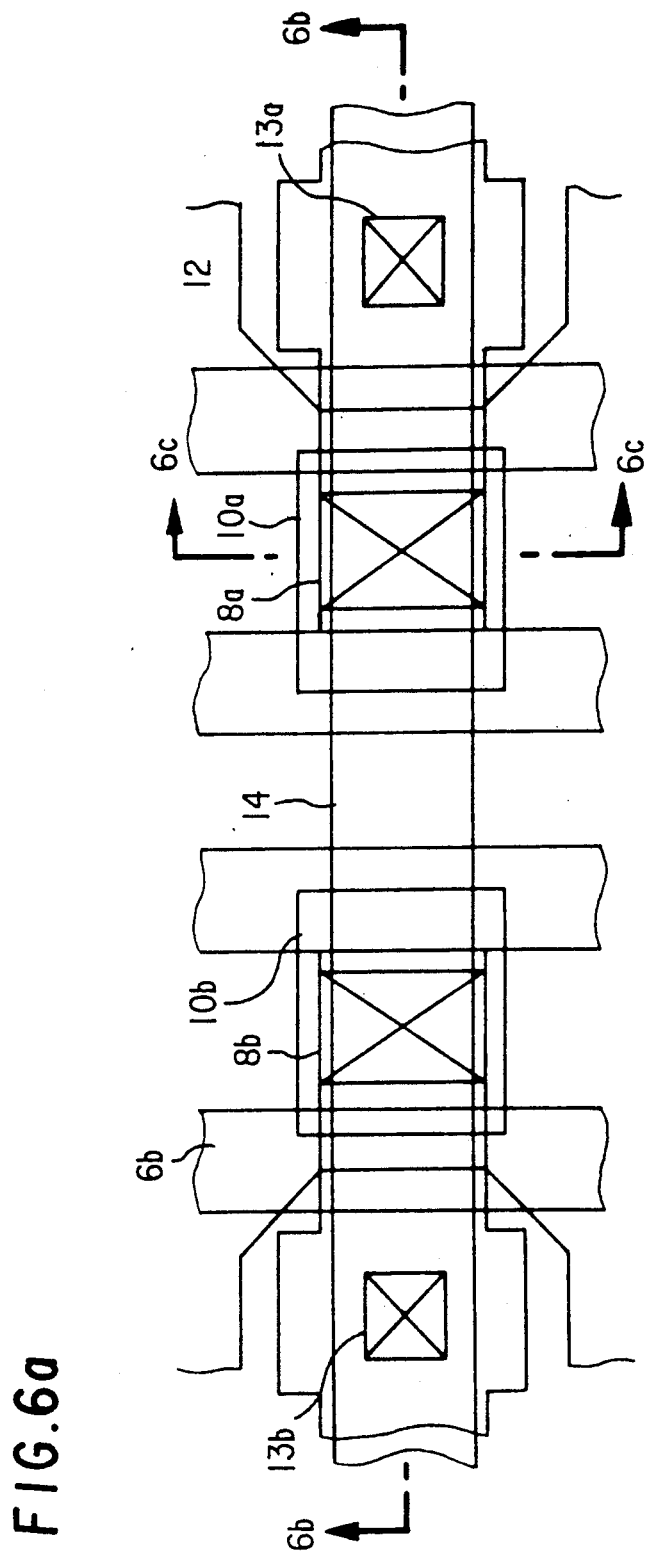

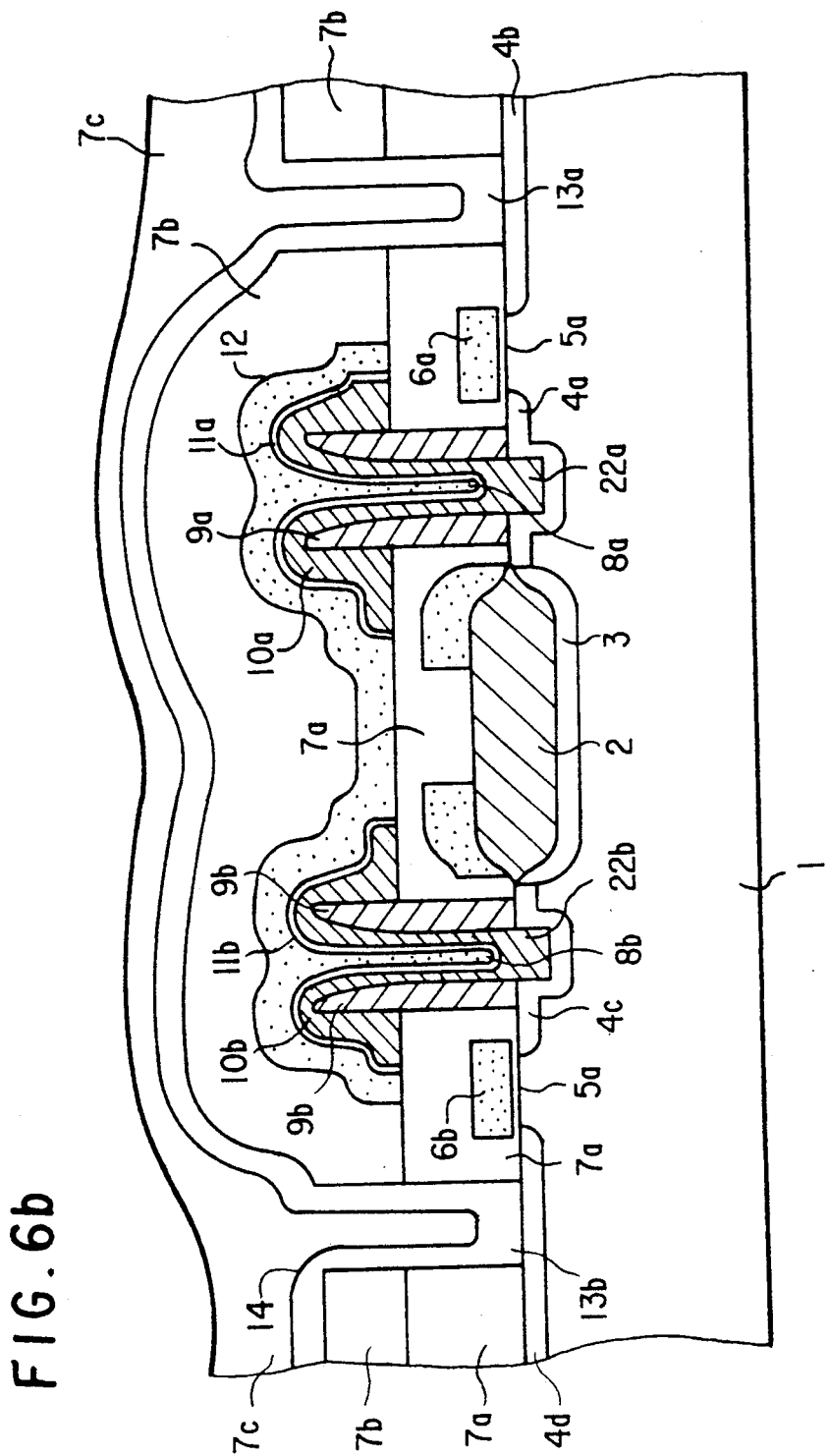

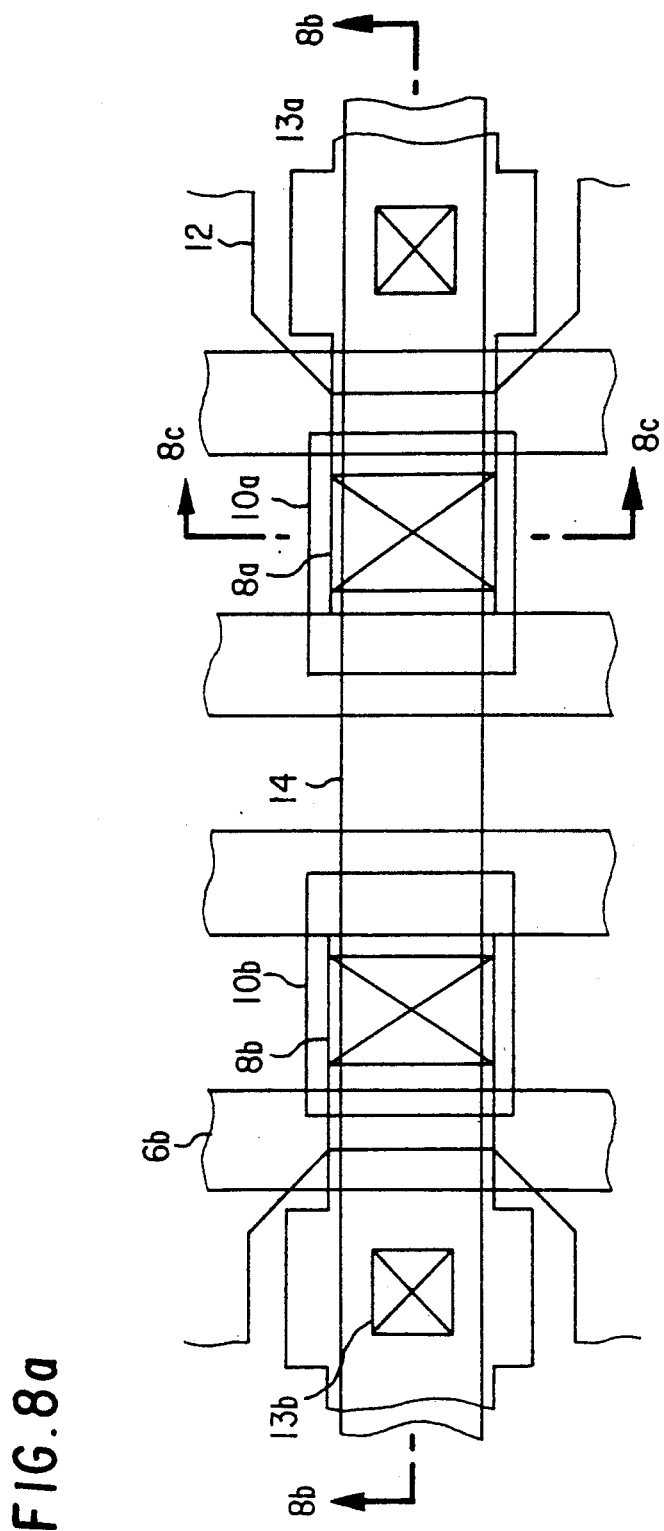

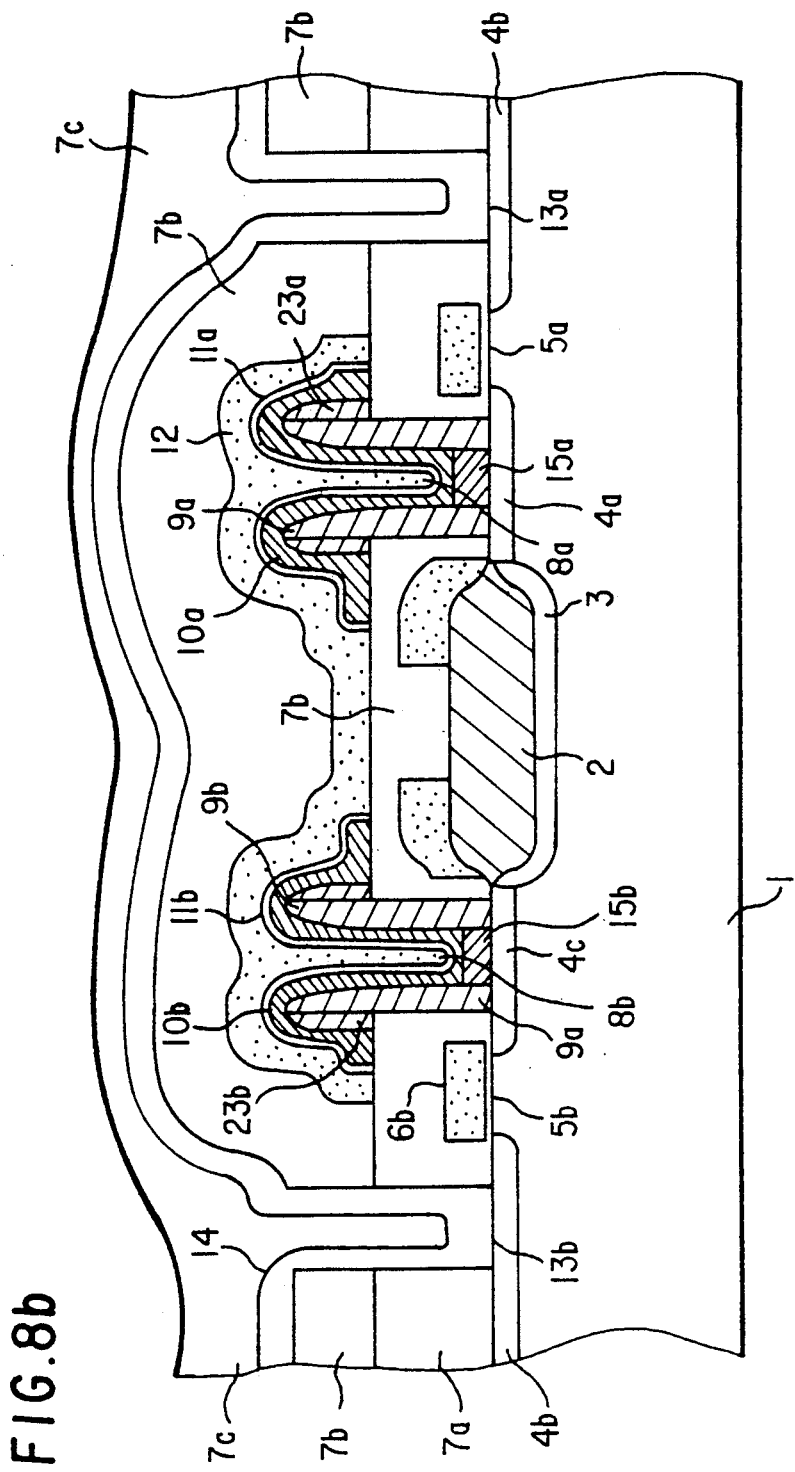

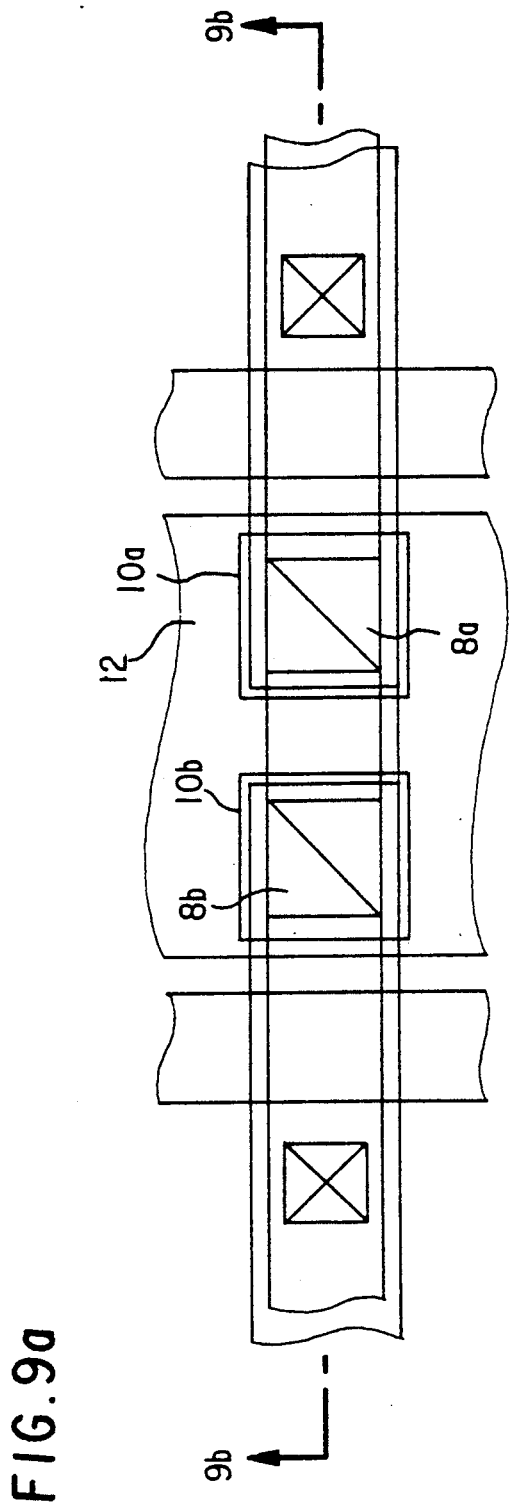

SEMICONDUCTOR MEMORY DEVICE WITH PILLAR-SHAPED INSULATING FILM

BACKGROUND OF THE INVENTION

1. Field of the Invention

This invention relates to a semiconductor memory device and a method of manufacturing the same, and more particularly to a semiconductor memory device having an improved capacitor configuration and a method of manufacturing the same.

2. Description of the Prior Art

In recent years, considerable progress has been made in semiconductor technology, particularly in the high-density integration of semiconductor integrated circuit elements. However, the high-density integration inevitably reduces the capacitor chip area that stores information (electric charge). The reduction of the capacitor chip area causes software errors such that the memory contents of the capacitors are erroneously read, or are easily destroyed by alpha rays or the like. Further, the gate lengths of MOS transistors are reduced, and this deteriorates their reliability.

In order to achieve the high-density integration of semiconductor memory devices while maintaining the large capacitance of the storage capacitors, various techniques have been disclosed. In one of such technique, the storage nodes of polycrystalline silicon or the like are formed on the silicon substrate. Thus, the capacitor areas are enlarged, and the capacitance thereof increases resulting in an increase of storage electric charge.

Specifically, switching transistors are formed on a semiconductor substrate, and storage capacitors are stacked on the memory cell regions of the substrate. One of the electrodes of the thus stacked capacitors is connected to one of the electrodes of the switching transistors. This is a so-called stacked-type memory cell configuration in which the capacitance of the storage capacitors is substantially increased.

The conventional stacked-type memory cell configuration is shown in FIGS. 10a through 10c. In FIG. 10b, an element-isolation insulating film 102 is formed in a p-type silicon substrate 101. In the substrate 101, memory cell regions 100a and 100b are isolated by the film 102. MOSFETs, which are used as switching transistors, are formed in the memory cell regions 100a and 100b. The MOSFETs are constituted respectively by source and drain regions 104a and 104b, source and drain regions 104c and 104d, and gate electrodes 106a and 106b, which are insulated by gate insulating films 105a and 105b. These source and drain regions 104a through 104d consist of n-type diffusion layers, respectively. Further, a first insulating film 107 is formed on the surface of the substrate 101. The film 107 has openings to which parts of the source regions 104a and 104c are exposed. First capacitor electrodes 110a and 110b are formed on the first insulating film 107. One end of the first capacitor electrode 110a is connected to the source region 104a through one of the openings in the film 107. Similarly, one end of the first capacitor electrode 110b is connected to the source region 104c through the other one of the openings in the film 107. On the respective surfaces of the first capacitor electrodes 110a and 110b, capacitor insulating films 111a and 111b are respectively deposited. A second capacitor electrode 112 is formed so as to cover the capacitor insulating films 111a and 111b, and the first insulating film 107, as shown in FIG. 10b.

The above-described stacked-type memory cell is manufactured as follows. Specifically, the source regions 104a and 104c, and the drain regions 104b and 104d, all consisting of n-type diffusion layers, are formed in the p-type silicon substrate 101. Thereafter, the gate electrodes 106a and 106b are formed interposing the gate insulating films 105a and 105b. As a result, the MOSFETs can be formed, which serve as the switching transistors with respect to storage capacitors.

Next, the insulating film 107 of silicon oxide is formed on the entire surface of the substrate 101. Thereafter, storage node contact holes 108a and 108b are made in the film 107. Next, the first capacitor electrodes 110a and 110b of polycrystalline silicon layers having a high-impurity concentration are formed.

Thereafter, the capacitor insulating films 111a and 111b of silicon oxide and the second capacitor electrode 112 of polycrystalline silicon are sequentially deposited on the first capacitor electrodes 110a and 110b.

Next, the substrate 101 is exposed to an atmosphere containing phosphorus, and thermally processed so that phosphorus is diffused into the polycrystalline silicon capacitor electrode 112. As a result, the electrode 112 has a prescribed conductivity. The thus formed second capacitor electrode 112, first capacitor electrodes 110a and 110b, and insulating films 111a and 111b constitute a MOS capacitor. Consequently, a memory cell consisting of MOSFETs and MOS capacitors can be obtained.

In the above-described configuration, the storage node electrode can be extended to the upper portion of the element-isolation region. Further, the steps of the gate electrodes can be utilized to increase the capacitance of the MOS capacitors. The thus obtained capacitance of the stacked-type memory cell can be increased to several times and up to several ten times that of a planar-type memory cell.

However, the miniaturization of chip elements to achieve higher-density integration has been steadily increasing. This inevitably reduces the memory cell chip area of DRAMs. As a result, the prescribed capacitance of storage capacitors can hardly be secured even when a conventional stacked-type memory cell configuration is employed.

SUMMARY OF THE INVENTION

Accordingly, one object of this invention is to provide a semiconductor memory device in which the miniaturization of a memory cell chip area can be achieved while maintaining the prescribed capacitance of storage capacitors.

Another object of this invention is to provide a method of manufacturing the semiconductor memory device.

Briefly, in accordance with one aspect of this invention, there is provided a semiconductor memory device which comprises a semiconductor substrate, an insulating film on the substrate, an opening made in the insulating film, exposing the substrate surface, a sidewall insulating film provided on the inner sidewall of the opening, having a thickness greater than that of the insulating film, a first conductive film on the sidewall insulating film, a capacitor insulating film on the first conductive film, and a second conductive film on the capacitor insulating film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1b is a cross-sectional view taken along line A—A of FIG. 1a;

FIG. 1c is a cross-sectional view taken along line B—B of FIG. 1a;

FIGS. 2a through 5c are views illustrating the processes in the first embodiment according to the present invention; Specifically, FIG. 2a is a plan view, FIG. 2b is a cross-sectional view taken along line A—A of FIG. 2a, and FIG. 2c is a cross-sectional view taken along line B—B of FIG. 2a;

FIG. 3b is a cross-sectional view taken along line A—A of FIG. 3a, and

FIG. 3c is a cross-sectional view taken along line B—B of FIG. 3a;

FIG. 4b is a cross-sectional view taken along line A—A of FIG. 4a, and

FIG. 4c is a cross-sectional view taken along line B—B of FIG. 4a;

FIG. 5a is a plan view,

FIG. 5b is a cross-sectional view taken along line A—A of FIG. 5a, and

FIG. 5c is a cross-sectional view taken along line B—B of FIG. 5a;

FIG. 6a is a plan view illustrating a third embodiment according to the present invention;

FIG. 6b is a cross-sectional view taken along line A—A of FIG. 6a;

FIG. 6c is a cross-sectional view taken along line B—B of FIG. 6a;

FIG. 7b is a cross-sectional view taken along line A—A of FIG. 7a;

FIG. 7c is a cross-sectional view taken along line B—B of FIG. 7a;

FIG. 8a is a plan view illustrating a fifth embodiment according to the present invention;

FIG. 8b is a cross-sectional view taken along line A—A of FIG. 8a;

FIG. 8c is a cross-sectional view taken along line B—B of FIG. 8a;

FIG. 9a is a plan view illustrating a sixth embodiment according to the present invention;

FIG. 9b is a cross-sectional view taken along line A—A of FIG. 9a;

FIG. 10b is a cross-sectional view taken along line A—A of FIG. 10a; and

FIG. 10c is a cross-sectional view taken along line B—B of FIG. 10a.

DESCRIPTION OF THE PREFERRED EMBODIMENTS

Figure 1A:
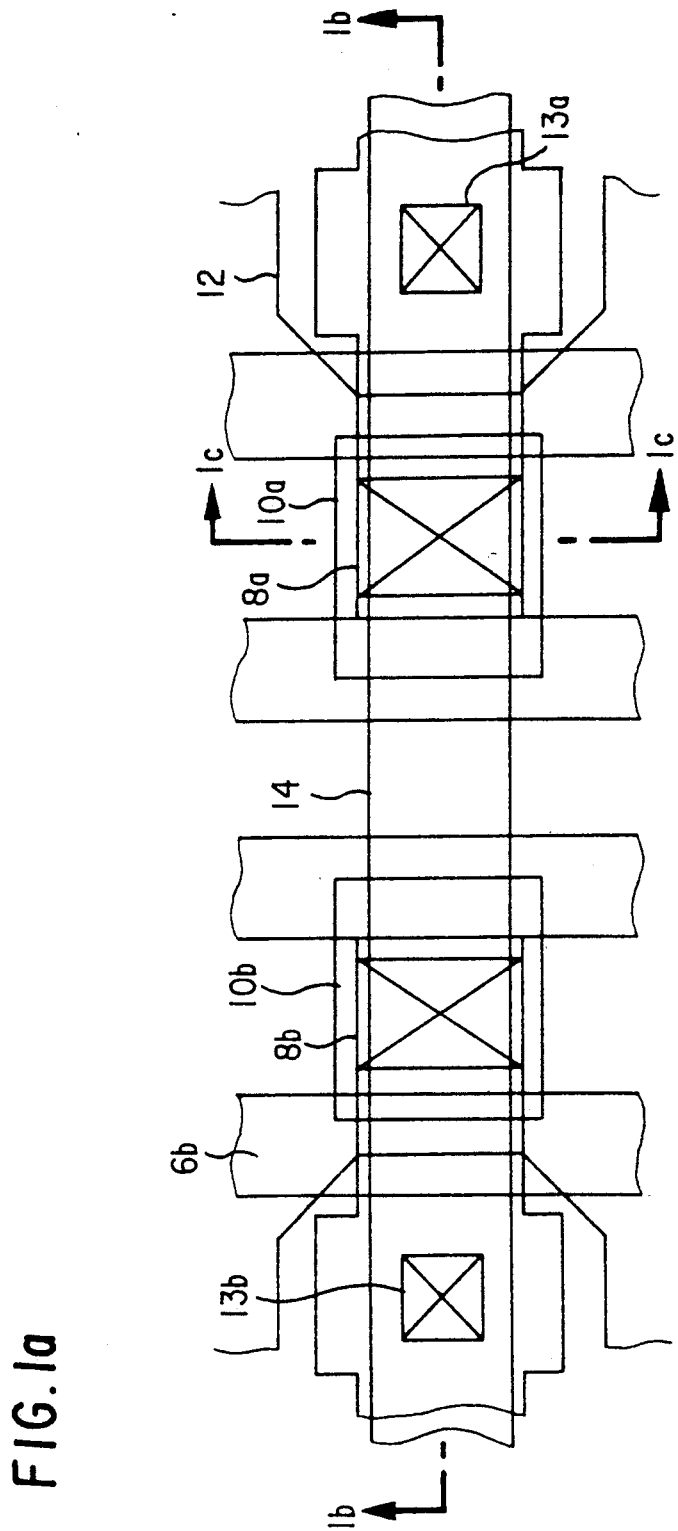
FIG. 1a is a plan view illustrating a first embodiment according to the present invention.

Referring now to the drawings, wherein like reference numerals designate identical or corresponding parts throughout the several views, and more particularly to FIG. 1 thereof, a first embodiment of this invention will be described.

Figure 1B:
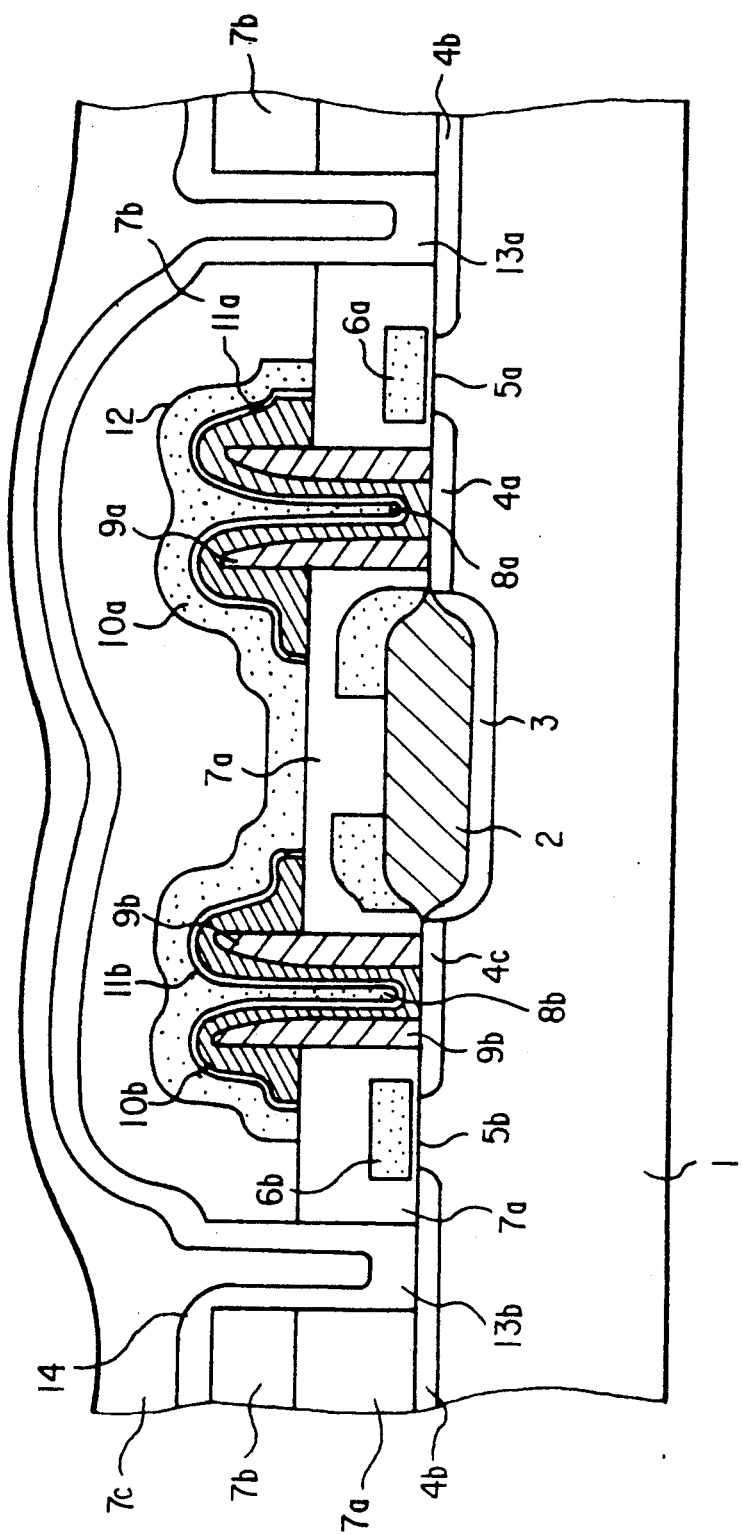
Figure 1C:
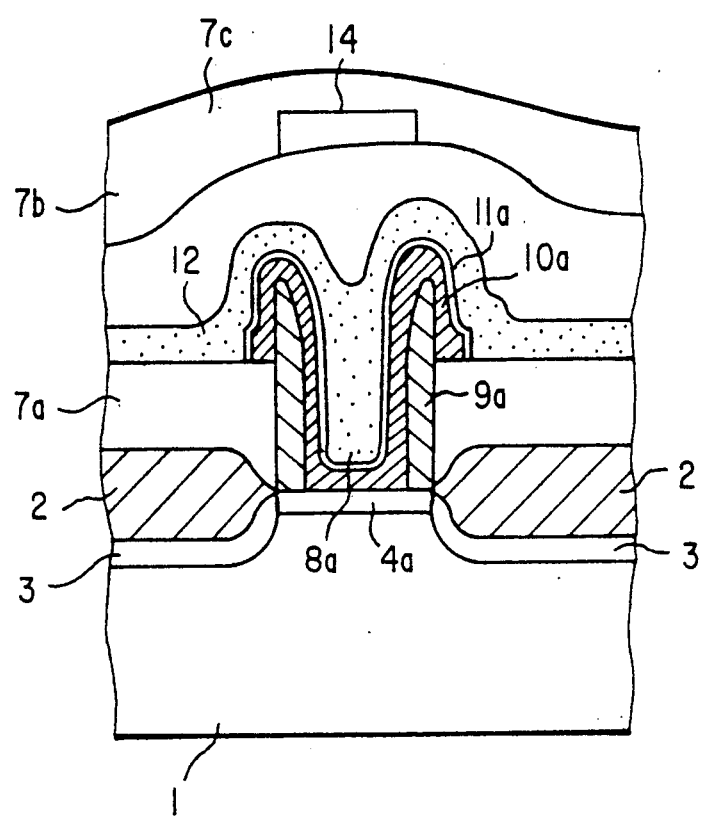

FIG. 1a is a plan view illustrating a stacked-type memory cell configuration of a DRAM according to a first embodiment of the present invention. FIG. 1a shows memory cells by two bits adjacent to each other in the direction of the bit line of the DRAM. FIGS. 1b and 1c are cross-sectional views taken along lines A—A and B—B of FIG. 1a, respectively.

The DRAM according to the present invention differs from the above-described conventional DRAM with stacked-type memory cells in that projecting plural storage node electrodes serve to constitute sufficiently large surface areas of storage capacitors.

Specifically, an element-isolation insulating film 2 is formed in a p-type silicon substrate 1, as shown in FIG. 1b. A p-type diffusion layer 3 is formed between the substrate 1 and the film 2, as a punchthrough stopper. In activation regions isolated by the element-isolation insulating film 2, two pairs of source and drain regions 4a through 4d of n-type diffusion layers are formed. Gate electrodes 6a and 6b are formed between the source regions 4a and 4c and the drain regions 4b and 4d, respectively. Gate insulating films 5a and 5b are formed between the gate electrodes 6a and 6b and the substrate 1, respectively. As a result, two MOSFETs are constituted.

Further, a first interlayer insulating film 7a is formed on the substrate 1. In the film 7a, storage node contact holes 8a and 8b are provided for exposing the surfaces of the source regions 4a and 4c. Sidewall insulating films 9a and 9b are provided on the inner sidewalls of the contact holes 8a and 8b. The films 9a and 9b have a thickness, perpendicular with respect to the substrate 1, greater than that of the first interlayer insulating film 7a. As a result, the upper portions of the sidewall insulating films 9a and 9b are formed projecting perpendicularly from the surface of the film 7a. Further, the sidewall insulating films 9a and 9b are shaped into hollow pillars, and the outer circumferences thereof are determined depending on the shapes of the contact holes 8a and 8b. Thus, the surfaces of the source regions 4a and 4c are exposed to the inside of the hollow pillar-shaped films 9a and 9b.

Storage node electrodes 10a and 10b are formed on the surfaces of the sidewall insulating films 9a and 9b. One end of the storage node electrode 10a is connected to the source region 4a. Similarly, one end of the storage node electrode 10b is connected to the source region 4c. As a result, the storage node contact with respect to the source regions 4a and 4c are constituted. Further, the electrodes 10a and 10b are respectively extended up to the surface of the first interlayer insulating film 7a, covering the upper portions of the projecting sidewall insulating films 9a and 9b. The electrodes 10a and 10b are formed only on the surfaces of the inner sidewalls of the sidewall insulating films 9a and 9b. In other words, the insides of films 9a and 9b are not filled up with the electrodes 10a and 10b. Capacitor insulating films 11a and 11b and a plate electrode 12 are sequentially deposited on the surfaces of the storage node electrodes 10a and 10b so as to constitute capacitors.

Further, a second interlayer insulating film 7b is formed on the substrate surface. In the first and second interlayer insulating films 7a and 7b, bit-line contact holes 13a and 13b are made. A bit line 14 of a compound film consisting of a highly doped polycrystalline silicon layer and a molybdenum silicide film is filled in the bit-line contact holes 13a and 13b. The bit line 14 is connected to the drain regions 4b and 4d.

Next, a method of manufacturing the DRAM with stacked-type memory cells according to the first embodiment of this invention will be described with reference to FIGS. 2a through 5c.

Figure 2B:
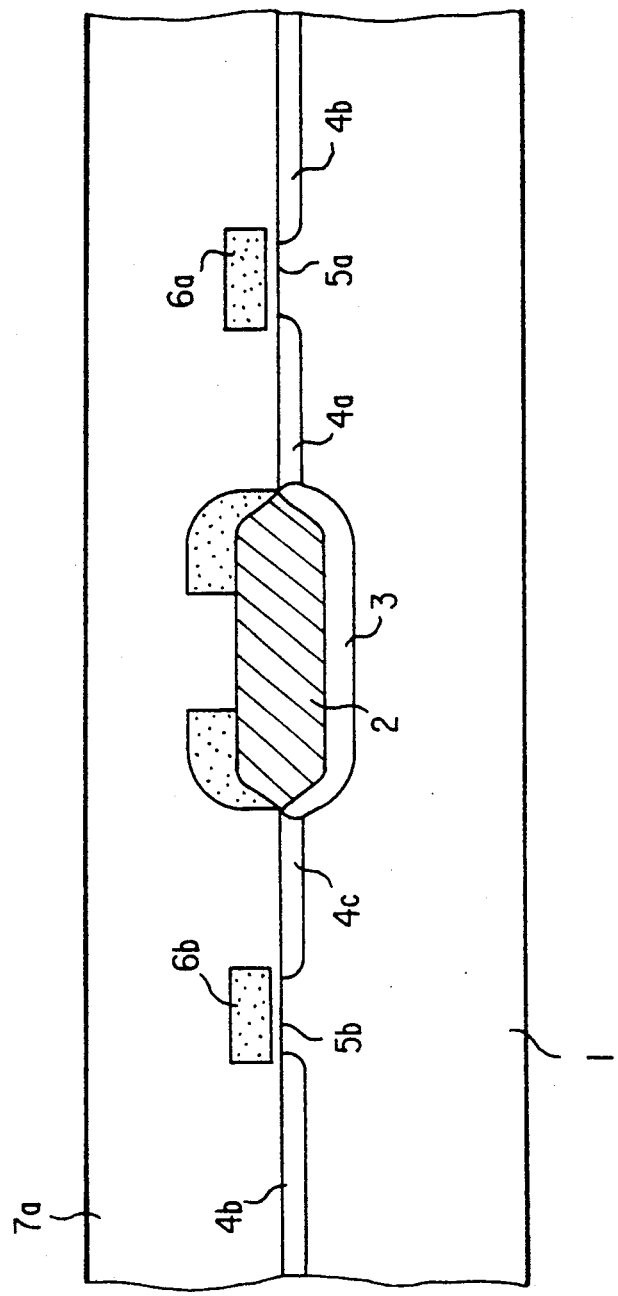
Figure 2C:
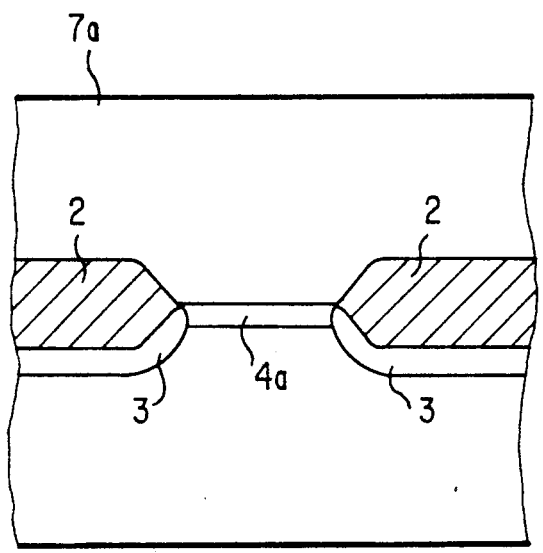

FIG. 2a is a schematic plan view illustrating a DRAM according to the present invention. FIGS. 2b and 2c are cross-sectional views taken along lines A—A and B—B of FIG. 2a, respectively. In FIG. 2b, an element-isolation insulating film 2 and a p-type diffusion layer 3 (that serves as a punchthrough stopper) are formed on a p-type monocrystalline silicon substrate having a specific resistance of 5 $\Omega$cm. This is performed by use of a conventional LOCOS (Local Oxidation of Silicon) technique. Thereafter, gate insulating films 5a and 5b (oxide silicon layers) of 10 nm thick and gate electrodes 6a and 6b (polycrystalline silicon layers) of 300 nm thick are formed on the substrate 1, respectively. This is performed by use of a thermal oxidation technique. The films 5a and 5b and electrodes 6a and 6b are respectively patterned in a prescribed manner. This is performed by use of a photographic lithography technique and a reactive ion etching technique. Next, an ion is ion-implanted into source regions 4a and 4c and drain regions 4b and 4d using the gate electrodes 6a and 6b as masks. Thus, the source and drain regions 4a through 4d of n-type diffusion layers are formed. As a result, two MOSFETs are formed as switching transistors. On the MOSFETs, BPSG (boron phosphide silicate glass) film is deposited by use of a CVD (chemical vapor deposition) technique. The BPSG film is evened by thermal processing so as to form a flat interlayer insulating film 7a, as shown in FIGS. 2b and 2c.

Figure 3A:
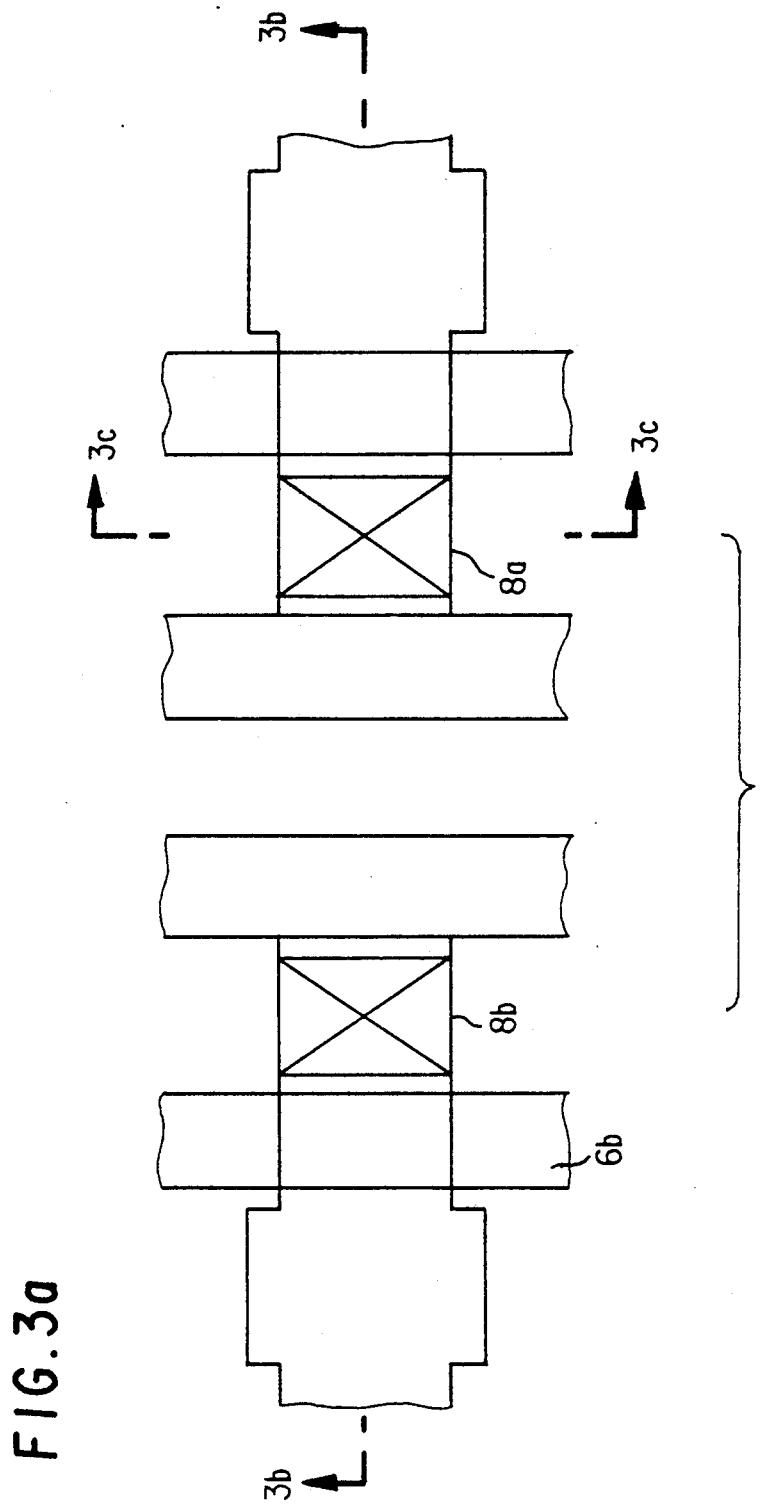
FIG. 3a is a plan view.
Figure 3B:
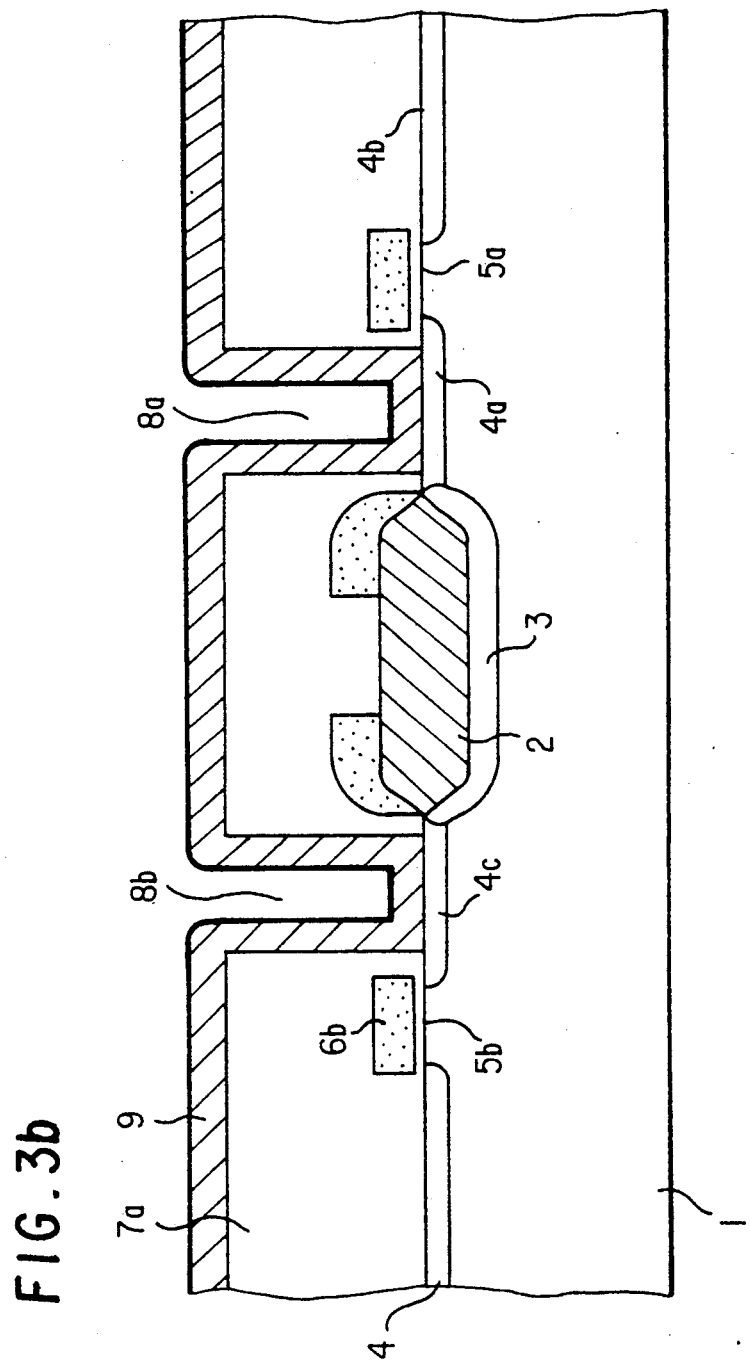
Figure 3C:
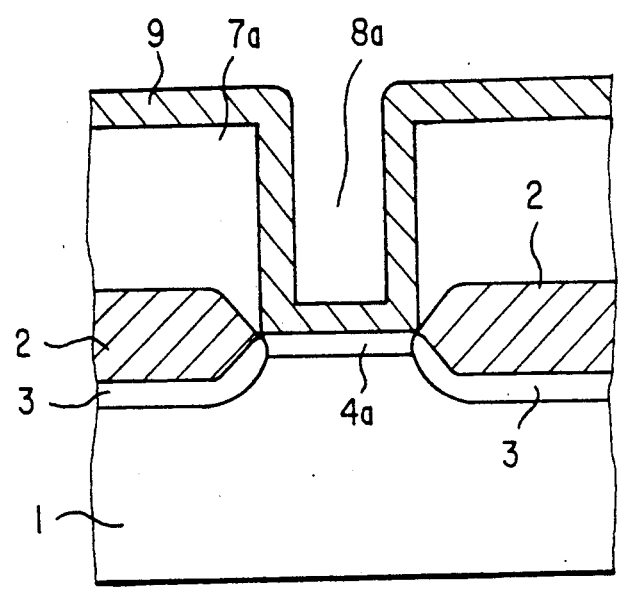

Next, storage node contact holes 8a and 8b are made in the substrate 1 by use of a photographic lithography technique and a reactive ion etching technique, is shown in FIGS. 3a through 3c. Further, an insulating film 9 of silicon nitride is deposited on the entire surface of the substrate 1 by use of a CVD technique.

Figure 4A:
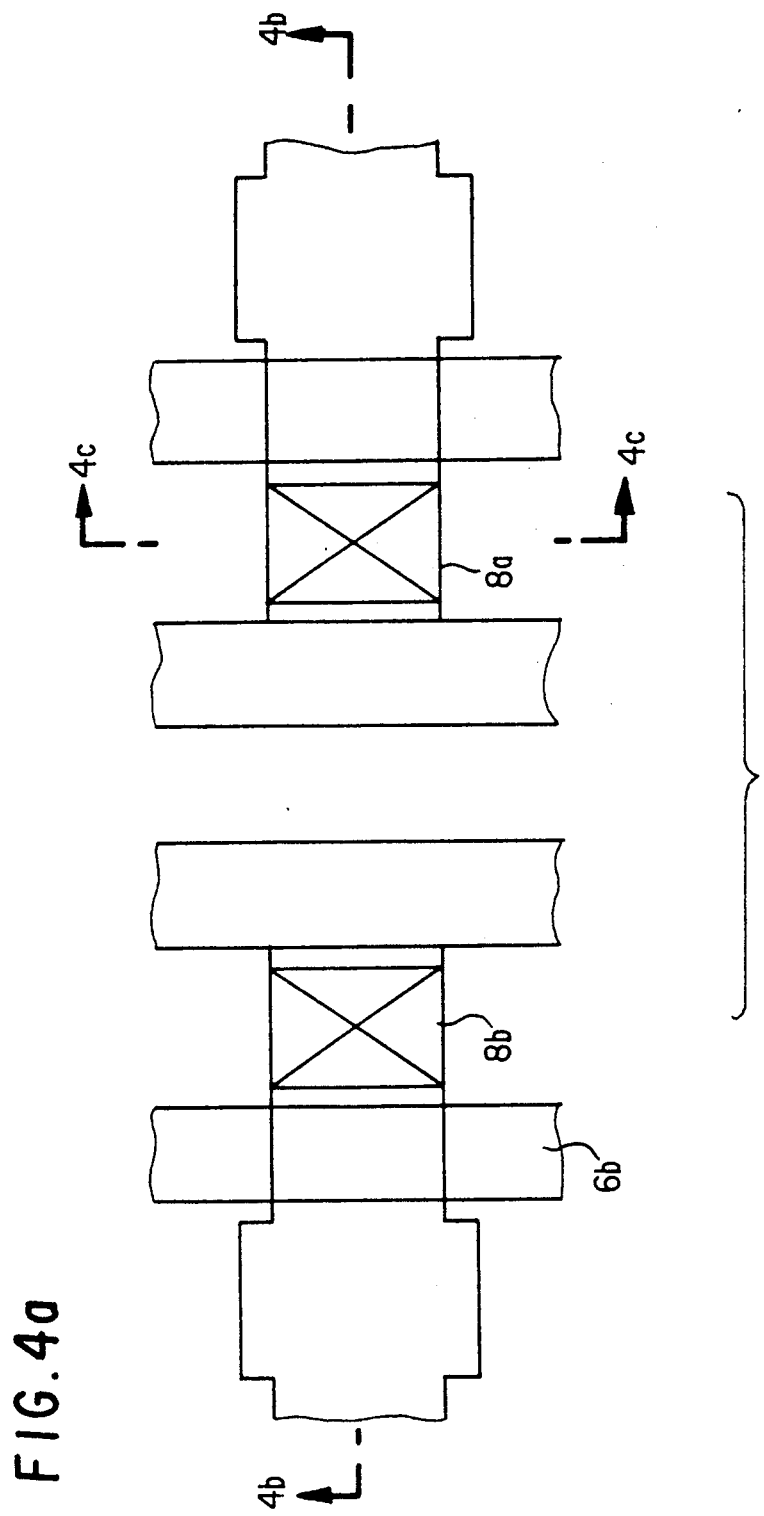
FIG. 4a is a plan view.
Figure 4B:
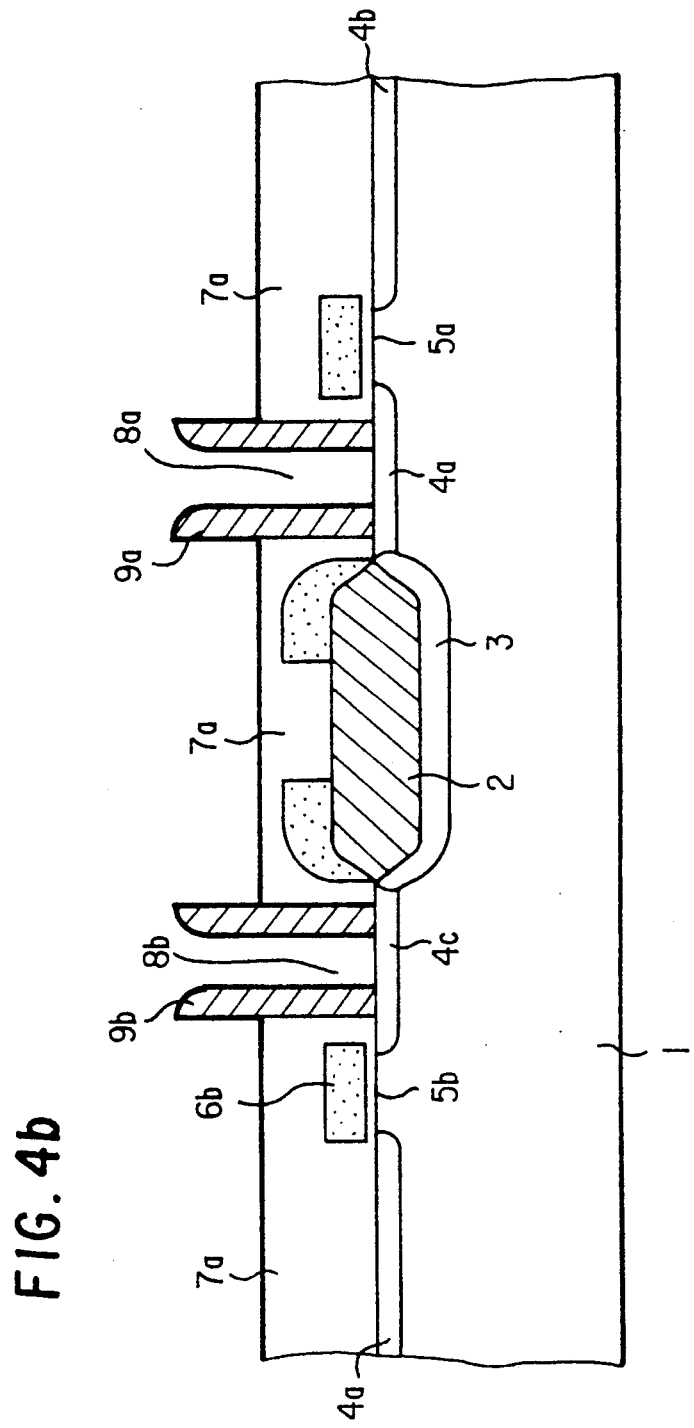
Figure 4C:
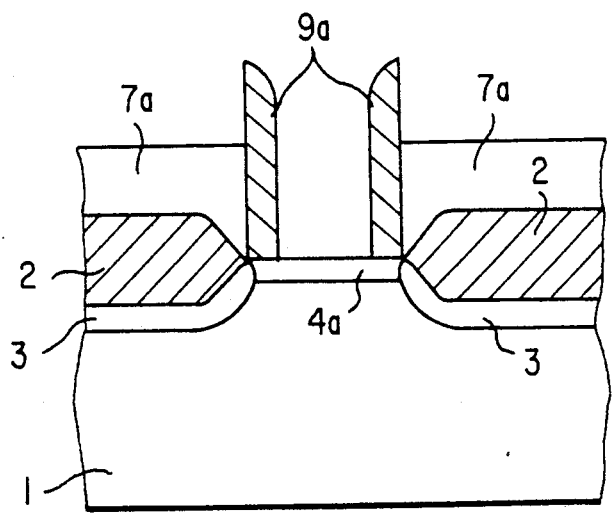

Next, the film 9 is eliminated except at the portions thereof deposited on the inner sidewalls of the storage node contact holes 8a and 8b. As a result, the sidewall insulating films 9a and 9b are formed projecting from the surface of the first interlayer insulating film 7a, as shown in FIGS. 4a through 4c. This is performed by use of an anisotropic etching technique under conditions such as follows. Specifically, the etching speed of the film 9 is slower than that of the first interlayer insulating film 7a. After the exposure of the film 7a, the etching process is continued so as to be slightly overetched. In this case, the etching of the film 7a progresses faster than that of the film 9. Thus, the films 9a and 9b can be formed projecting from the surface of the film 7a. Further, when the projections of the films 9a and 9b are required to be greater, this can be achieved by modifying the etching conditions using an NH$_4$F solution etc., such that the film 7a can be selectively etched.

Figure 5B:
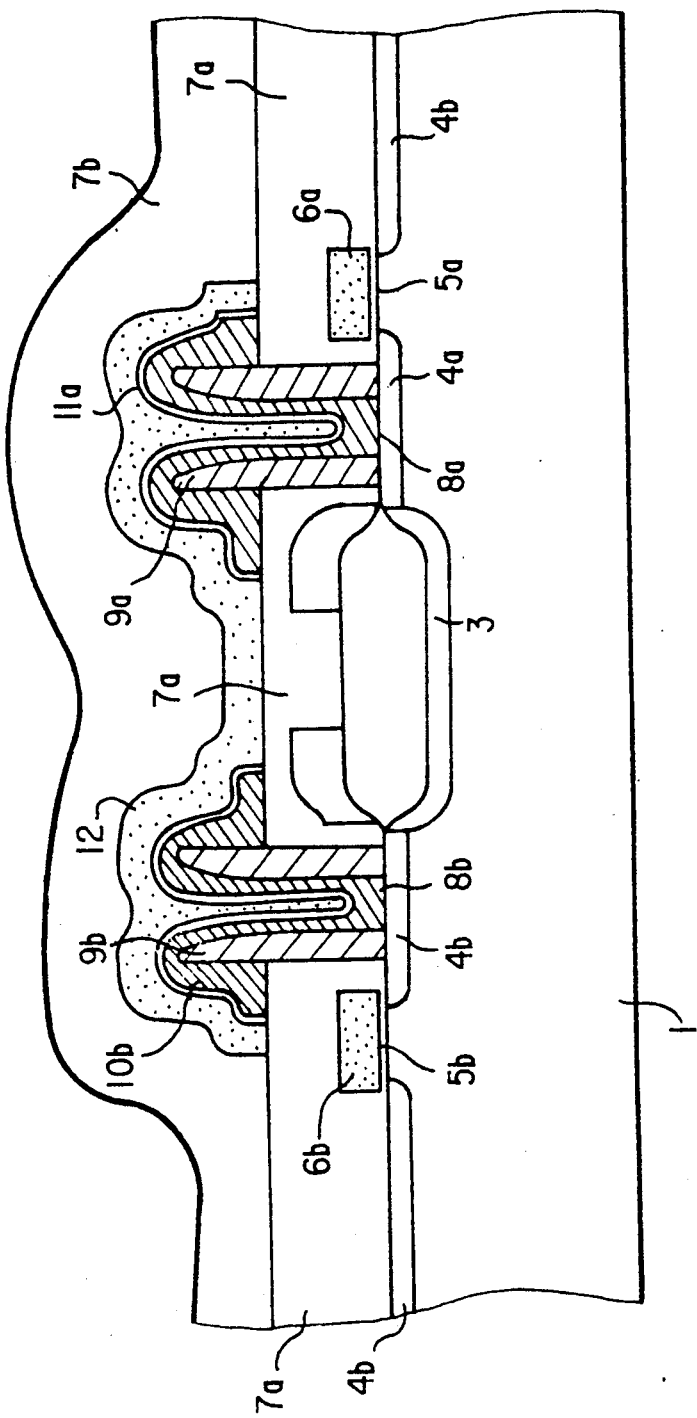
Figure 5C:
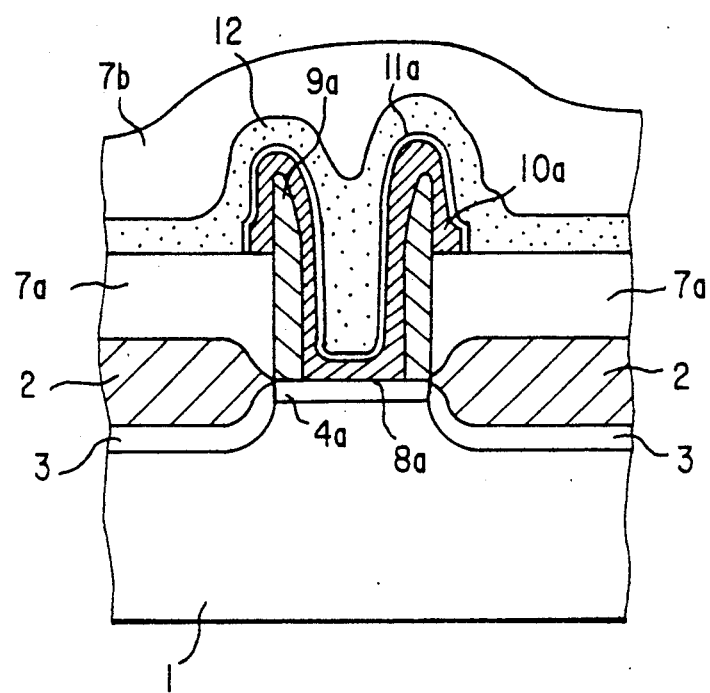

Next, as is shown in FIGS. 5a through 5c, storage node electrodes 10a and 10b are formed as follows. Specifically, a polycrystalline silicon film is deposited on the entire surface of the substrate 1, and an impurity is doped into the thus deposited polycrystalline silicon film. Thereafter, the impurity-doped polycrystalline silicon film is patterned by use of a photographic lithography technique and a reactive ion etching technique. As a result, storage node electrodes 10a and 10b are formed. Next, a silicon nitride film of about 10 nm is deposited on the entire surface of the storage node electrodes 10a and 10b. This is performed by use of a CVD technique. Next, the substrate 1 is exposed to a steam atmosphere of 950° C. for about 30 minutes so as to oxidize the surface of the thus deposited silicon nitride film.

As a result, capacitor insulating films 11a and 11b of a two-layer configuration (a silicon oxide film and a silicon nitride film) can be formed. Further, a polycrystalline silicon film is deposited on the entire surface of the substrate 1 and an impurity is doped into to the film 11. Thereafter, the impurity-doped polycrystalline silicon film is patterned by use of a photographic lithography technique and a reactive ion etching or an isotropic etching so as to form a plate electrode 12. Further, unnecessary portions of the capacitor insulating films 11a and 11b are eliminated using the thus patterned plate electrode 12 as a mask. Next, a second interlayer insulating film 7b of silicon oxide is deposited on the entire surface of the substrate 1.

Thereafter, as shown in FIGS. 1a through 1c, bit-line contact holes 13a and 13b are formed penetrating through the films 7a and 7b by use of a photographic lithography technique and a reactive ion etching technique. Next, a compound film of an arsenic-doped polycrystalline silicon film and a molybdenum silicide film is deposited on the entire surface of the substrate 1. The thus deposited compound film is patterned by use of a photographic lithography technique and a reactive ion etching technique. As a result, a bit line 14 is formed. Thereafter, a third interlayer insulating film 7c of silicon oxide is deposited on the entire surface of the substrate 1.

As described above, the sidewall insulating films 9a and 9b of the storage node contact holes 8a and 8b are formed projecting from the surface of the interlayer insulating film 7a. The storage node electrodes 10a and 10b are provided on the thus formed step configuration. Thus, surface areas of the electrodes 10a and 10b can be obtained larger by such step portions. As a result, the capacitance of the storage capacitors can be significantly increased. Therefore, a prescribed capacitance of the storage capacitors can be securely maintained even when corresponding memory cell chip areas are miniaturized.

Moreover, the inner sidewalls of the storage node contact holes 8a and 8b are covered with the sidewall insulating films 9a and 9b. Thus, the occurrence of a short-circuit phenomena between the gate electrodes 6a and 6b and the storage node electrodes 10a and 10b, respectively, can be prevented. Particularly, in this embodiment, double-insulation structures are formed between the gate electrodes 6a and 6b and the storage node electrodes 10a and 10b. Such double-insulation structures consist of the interlayer insulating film 7a of silicon oxide and the sidewall insulating films 9a and 9b of silicon nitride. Thus, satisfactory insulation characteristics therebetween can be achieved. As a result, the insulation therebetween can be securely maintained against a high-potential electric field.

Further, assume that the storage node contact holes 8a and 8b are shifted from prescribed positions during the formation thereof, resulting in the exposure of the electrodes 6a and 6b. Even in such a case, the insulation between the gate electrodes 6a and 6b and the storage node electrodes 10a and 10b can be securely maintained by the sidewall insulating films 9a and 9b.

Moreover, in this embodiment, the interlayer insulating film 7a is made of oxide silicon, and the sidewall insulating films 9a and 9b are made of silicon nitride. However, the constituent contrary to this may also be employed. Namely, the interlayer insulating film 7a may be made of silicon nitride, and the sidewall insulating films 9a and 9b may be made of silicon oxide. In this case, after remaining silicon oxide film on the sidewall only of the storage node contact using an anisotropic etching, the sidewall insulating films 9a and 9b of silicon oxide are formed by selectively etching silicon nitride film use of a wet etching technique using heated phosphoric acid, as shown in FIGS. 1a through 1c.

Further, after the formation of the sidewall insulating films 9a and 9b of silicon oxide, ion implantation of a high concentration may also be performed so as to constitute an LDD (Lightly Doped Drain) configuration.

In this embodiment, the capacitor insulating films 11a and 11b are of the two-layer configuration of silicon oxide film and silicon nitride film. However, various film configurations other than this, for example, silicon oxide films or metal oxide films such as tantalum pentoxide ($Ta_2O_5$) or the like may also be employed.

Furthermore, in this embodiment, it is desirable that the storage node electrodes 10a and 10b in the sidewall insulating films 9a and 9b bury the sidewall insulating films 9a and 9b. However, if the electrodes 10a and 10b are buring the films 9a and 9b, the sufficient capacitor effect is secured based on the increasing effect of the capacitor area caused by the outer steps of the sidewall insulating films 9a and 9b.

Next, a second embodiment of this invention will be described. In this embodiment, after the formation of the sidewall insulating films 9a and 9b, the tip portions thereof are rounded by use of an argon sputtering technique. Other processes of manufacturing the device in this embodiment are the same as those in the first embodiment. This rounded-tip structure can prevent the concentration of electric fields applied to the capacitor insulating films 11a and 11b. As a result, the reliability of the device according to the present invention can be significantly enhanced.

Moreover, the process of rounding the tip portions of the films 9a and 9b is not limited to the argon sputtering technique, but other techniques may also be employed.

Figure 6C:
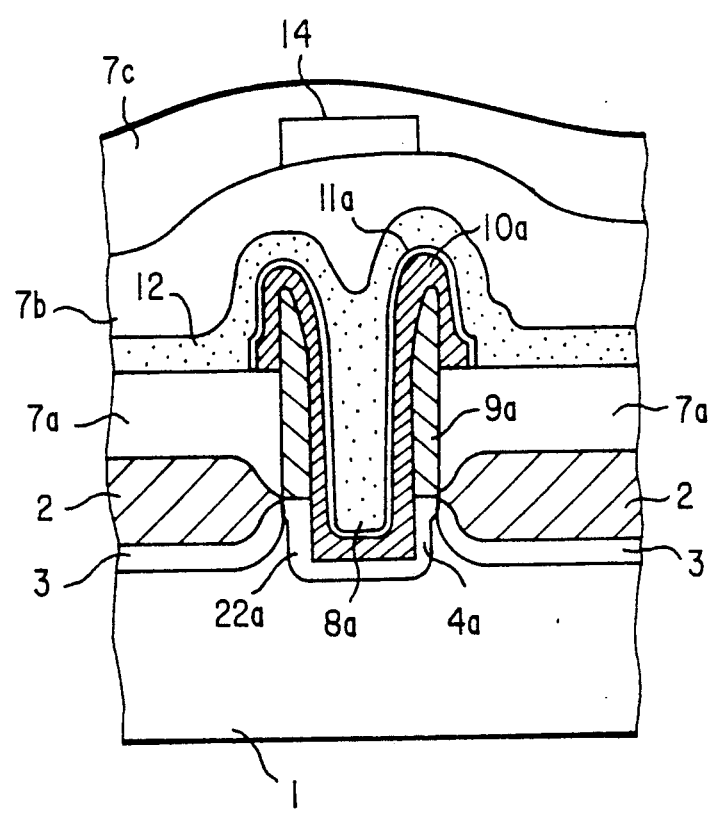

Next, a third embodiment of this invention will be described with reference to FIGS. 6a trough 6c. In this embodiment, trenches 22a and 22b are provided at the bottom of storage node contact holes 8a and 8b. Thus, storage node electrodes 10a and 10b can be formed deeper by the depth of the trenches 22a and 22b. As a result, the surface areas of the storage capacitors can be enlarged.

In the process of manufacturing the device in this embodiment, storage node contact holes 8a and 8b are formed, and sidewall insulating films 9a and 9b are formed in the same manner as those in the first embodiment, as shown in FIGS. 4a through 4c. Thereafter, the trenches 22a and 22b are formed in the portions of the substrate 1, which are exposed to the inside of the holes 8a and 8b.

In this embodiment, even when the trenches 22a and 22b are formed deeper than the source and drain regions 4a through 4d, there is no possibility of forming a so-called offset. This is because the impurities from the storage node electrodes 10a and 10b are diffused so as to form impurity regions 22a and 22b.

Figure 7A:
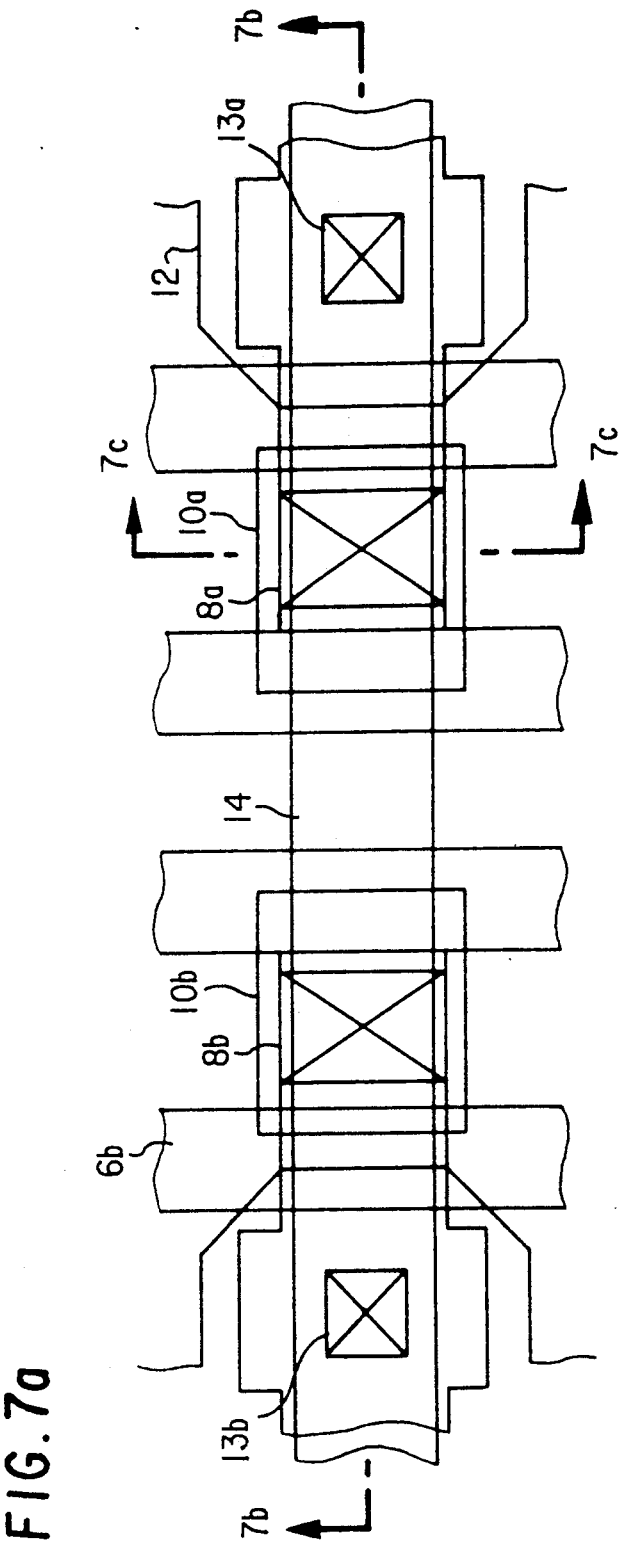
FIG. 7a is a plan view illustrating a fourth embodiment according to the present invention.
Figure 7B:
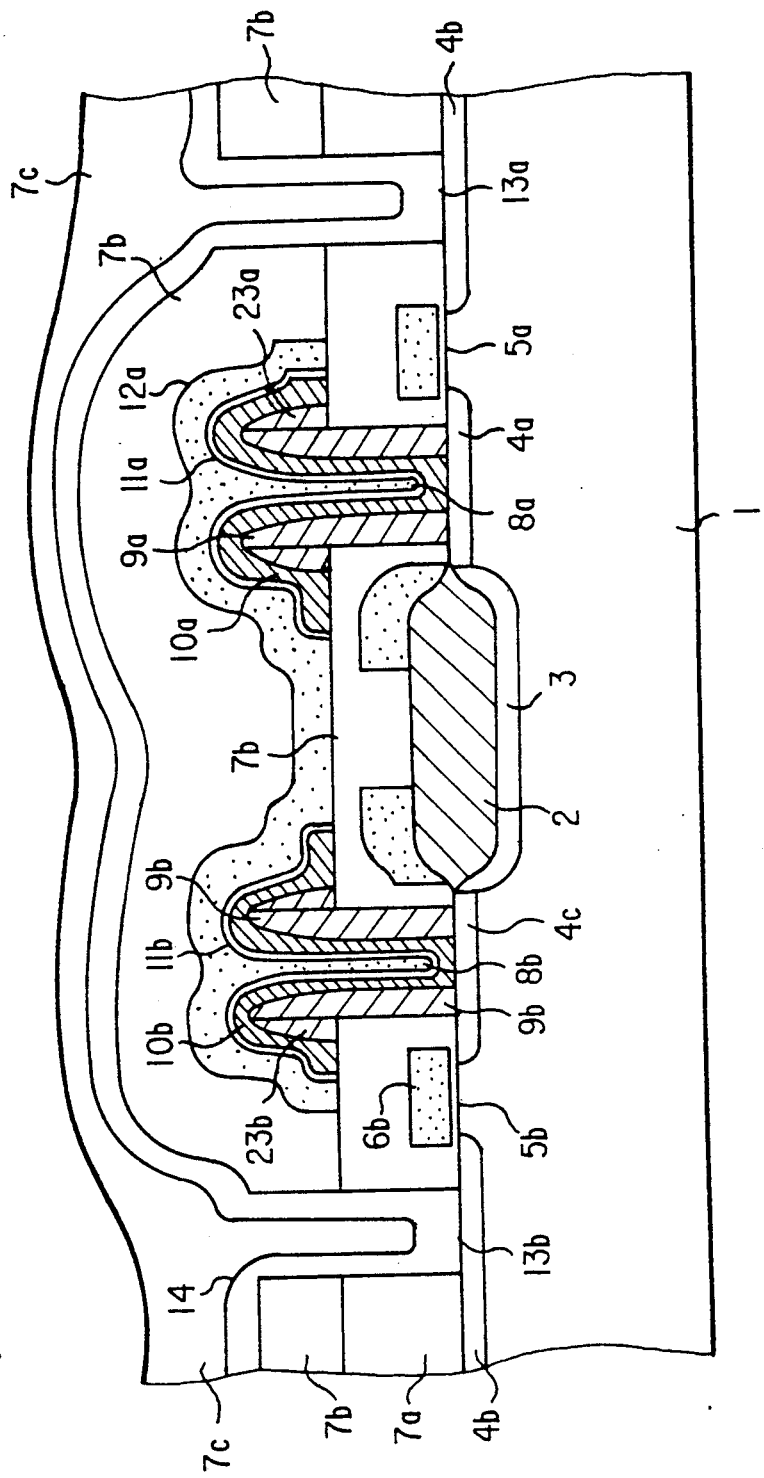
Figure 7C:
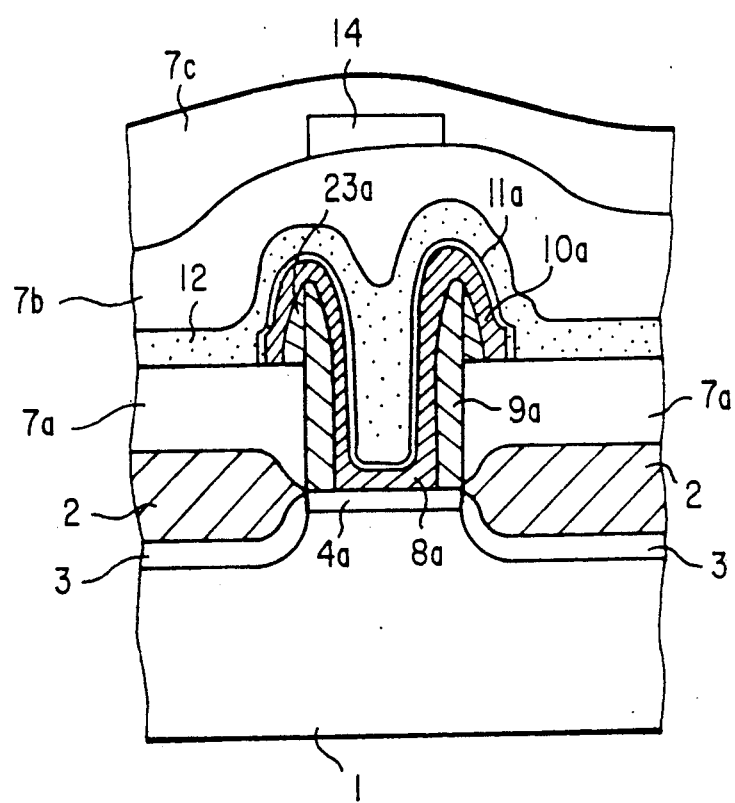

Next, a fourth embodiment of this invention will be described with reference to FIGS. 7a through 7c. In this embodiment, first sidewall insulating films 9a and 9b are formed on the inner sidewalls of storage node contact holes 8a and 8b. Thereafter, second insulating films 23a and 23b are deposited on the films 9a and 9b. Next, the films 23a and 23b are partially eliminated by use of an anisotropic etching technique. As a result, the parts of films 23a and 23b remain on the steep sidewall portions of insulating films 9a and 9b. The films 23a and 23b serve to round the tip angles of the films 9a and 9b.

This rounded-tip structure can prevent the concentration of electric fields applied to the capacitor insulating films 11a and 11b. As a result, the reliability of the device according to the present invention can be significantly enhanced.

Figure 8C:
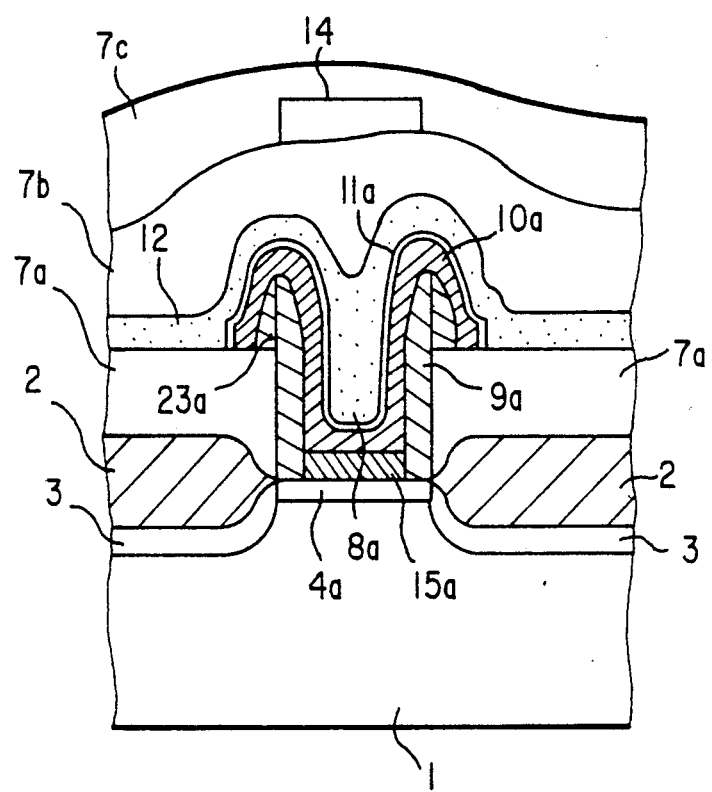

Next, a fifth embodiment of this invention will be described with reference to FIGS. 8a through 8c. In this embodiment, epitaxial growth layers 15a and 15b of monocrystalline silicon are additionally formed at the bottom portions of storage node contact holes 8a and 8b. This is performed by use of a selective epitaxial growth technique prior to the formation of storage node electrodes 10a and 10b. The epitaxial growth layers 15a and 15b serve to suppress the diffusion of impurities contained in the storage node electrodes 10a and 10b.

In a conventional structure, the impurities contained in storage node electrodes are diffused into portions under the transistor gate electrodes or element isolation regions during the thermal processing performed thereafter. This causes the short channel effect, which deteriorates the transistor characteristics or lowers the punch-through withstand voltage. In this embodiment, the diffusion of impurities toward the substrate can be minimized by the epitaxial growth layers 15a and 15b. Specifically, the layers 15a and 15b are formed between the storage node contact holes 8a and 8b and the storage node electrodes 10a and 10b. Thus, the reliability of the device according to the present invention can be enhanced while maintaining the prescribed capacitor surface areas.

In the previous embodiments, the DRAM having the stacked-type capacitor configuration in which is formed the bit lines after the forming of the capacitor has been described. However, this invention is useful for the DRAM having the stacked-type capacitor configuration in which is formed the capacitors after the forming the gate electrodes and the bit lines.

Figure 9B:
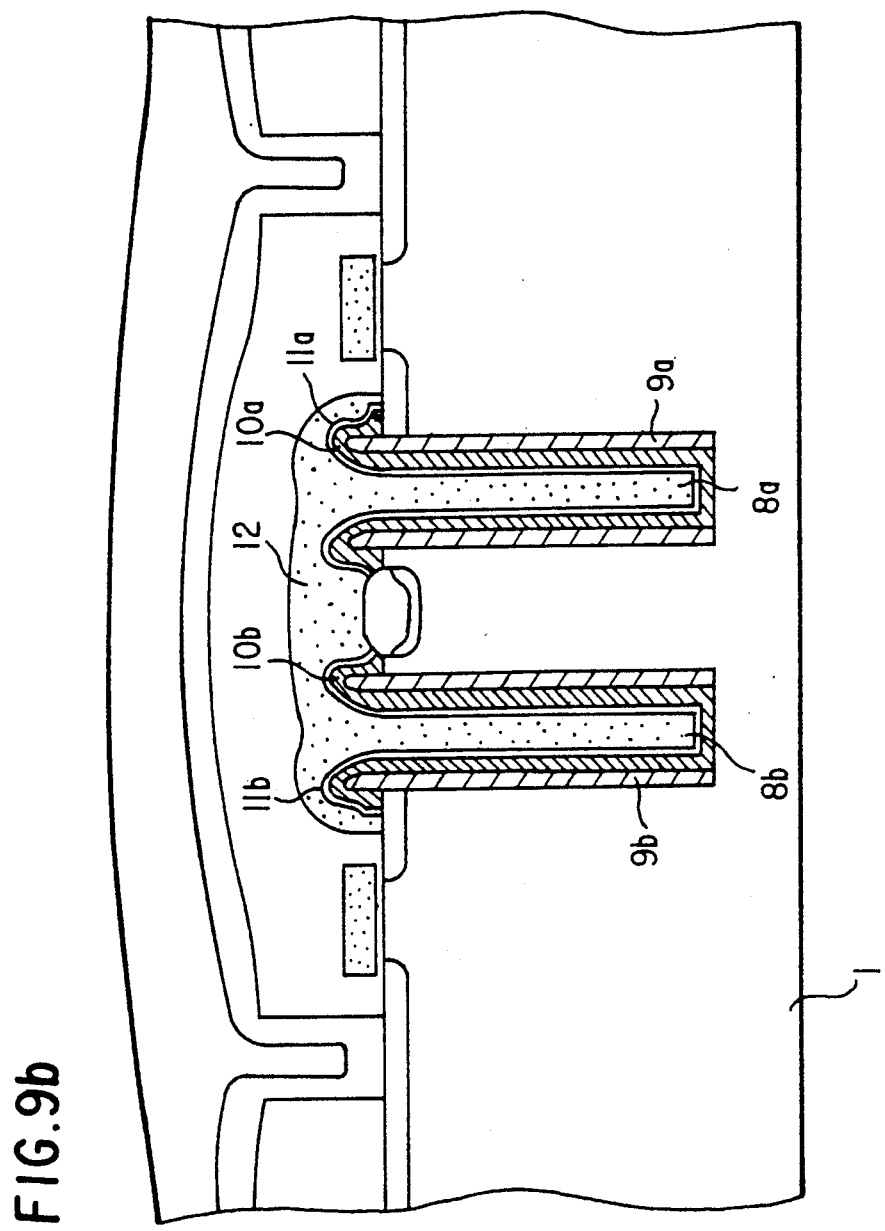
Figure 10A:
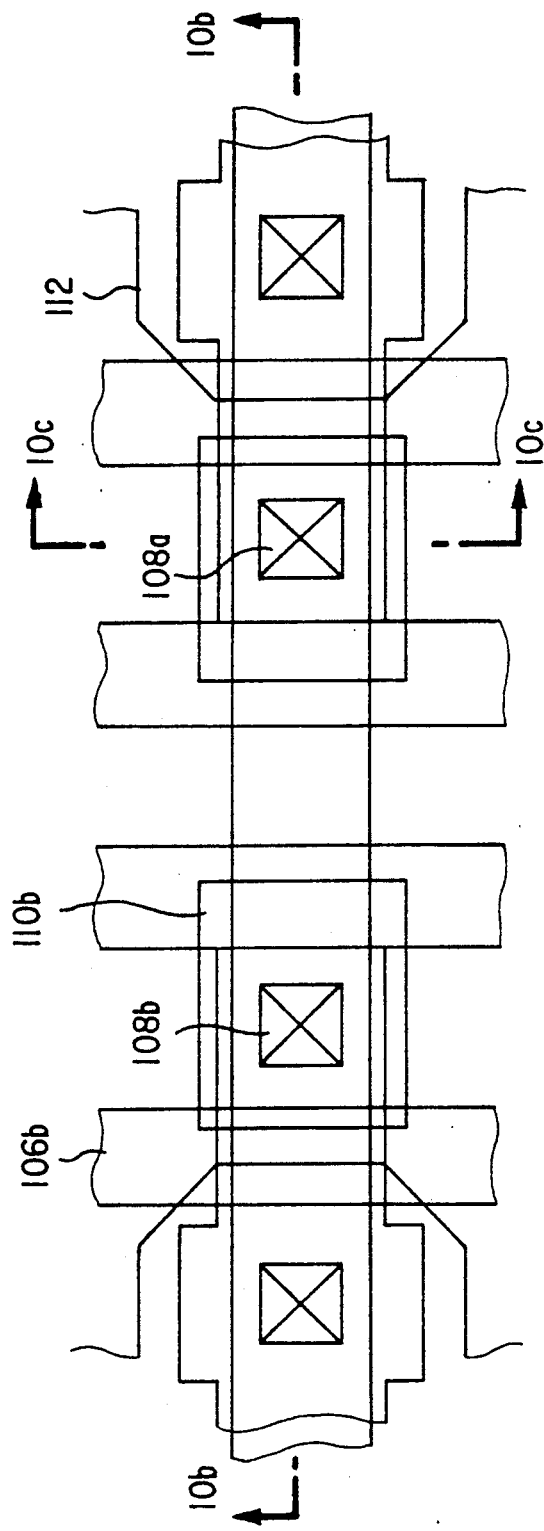
FIG. 10a is a plan view illustrating a conventional device.
Figure 10B:
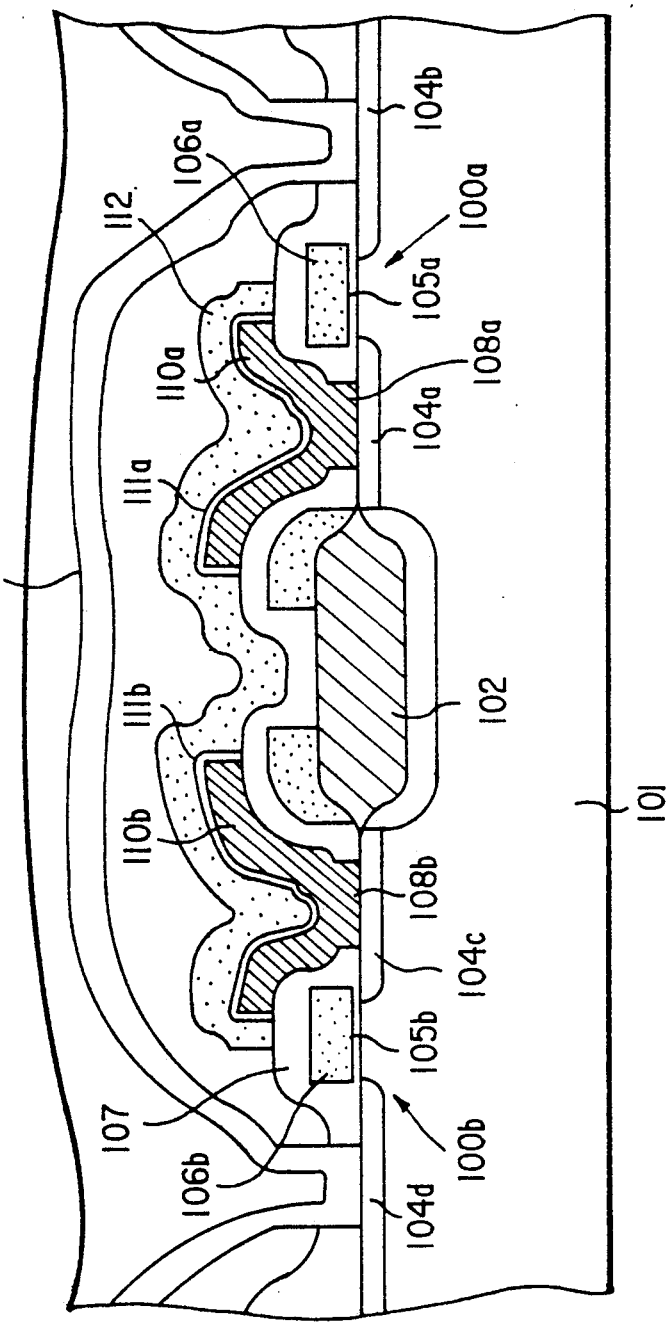
Figure 10C:
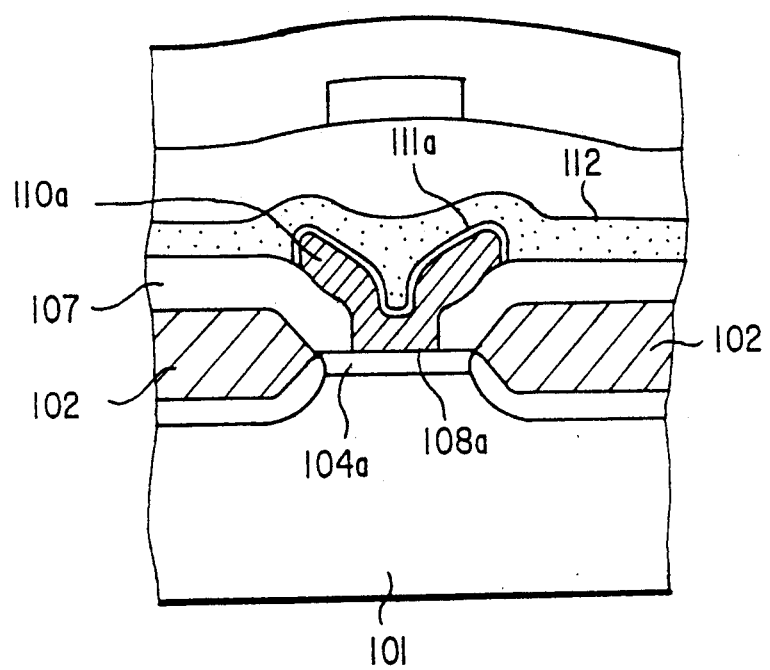

Furthermore, in the previous embodiments, the stacked-type capacitor configuration of the DRAM has been described. However, this invention can also be applied to a trench capacitor configuration of a DRAM shown in FIGS. 9a and 9b.

Specifically, storage node contact holes 8a and 8b are formed in the substrate 1 deeper toward the inside thereof. Thereafter, sidewall insulating films 9a and 9b, storage node electrodes 10a and 10b, capacitor insulating films 11a and 11b, and a plate electrode 12 are sequentially formed in the storage node contact holes 8a and 8b, and on the substrate surface, respectively. In this case, the same advantages as those in the previous embodiments can be obtained.

As described above, according to the present invention, there can be provided a semiconductor memory device having a plurality of stacked-type memory cells, each of which is constituted as follows. Specifically, a sidewall insulating film is formed on the inner sidewall of a storage node contact hole, projecting from an interlayer insulating film. Further, a storage node electrode is formed on the projecting film. Thus, the surface area of the storage node electrode can be enlarged. As a result, a memory cell chip area can be miniturized while maintaining the prescribed capacitance of the storage capacitor.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor memory device, comprising: a semiconductor substrate;
   an insulating film on the semiconductor substrate; an opening provided in the insulating film, exposing the substrate surface;
   a hollow pillar-shaped sidewall insulating film provided on the inner sidewall of the opening, having a thickness, perpendicular with respect to the substrate, greater than that of said insulating film;
   a first conductive film on the sidewall insulating film;
   a capacitor insulating film on the first conductive film; and
   a second conductive film on the capacitor insulating film; and
   a second sidewall insulating film on the outer circumference of the sidewall insulating film.

2. A semiconductor memory device, comprising: a semiconductor substrate;
   an insulating film on the semiconductor substrate; an opening provided in the insulating film, exposing the substrate surface;
   a hollow pillar-shaped sidewall insulating film provided on the inner sidewall of the opening, having a thickness, perpendicular with respect to the substrate, greater than that of said insulating film;
   a first conductive film on the sidewall insulating film;
   a capacitor insulating film on the first conductive film; and
   a second conductive film on the capacitor insulating film; and
   a semiconductor layer provided in the opening and between the first conductive film and the substrate surface.

3. A semiconductor memory device, comprising:
   a first conductive-type semiconductor substrate;
   a pair of second conductive-type diffusion regions provided on the substrate surface;
   a gate insulating film provided on the substrate surface and between the pair of diffusion regions;
   a gate electrode on the gate insulating film;
   a first interlayer insulating film on the substrate surface;
   a first opening provided in the interlayer insulating film, exposing one of the diffusion regions;
   a hollow pillar-shaped sidewall insulating film provided on the inner sidewall of the first opening, having a thickness, perpendicular with respect to the substrate greater than that of the first interlayer insulating film;
   a first conductive film provided on the surface of the sidewall insulating film, on one of the diffusion regions exposed to the inside of the first opening, and on the surface of the first interlayer insulating film in proximity to the sidewall insulating film;
   a capacitor insulating film on the first conductive film;
   a second conductive film on the capacitor insulating film;
   a second interlayer insulating film provided on the substrate surface;
   a second opening provided penetrating the first and second interlayer insulating films, exposing the other one of the diffusion regions;
   an electrode provided in the second opening, being connected to the other one of the diffusion regions, and extending on the surface of the second interlayer insulating film; and
   a trench provided on the substrate surface, being exposed to the inside of the sidewall insulating film, wherein said one of the diffusion regions is curved along said trench.

4. A semiconductor memory device, comprising:
   a first conductive-type semiconductor substrate;
   a pair of second conductive-type diffusion regions provided on the substrate surface;
   a gate insulating film provided on the substrate surface and between the pair of diffusion regions;
   a gate electrode on the gate insulating film;
   a first interlayer insulating film on the substrate surface;
   a first opening provided in the interlayer insulating film, exposing one of the diffusion regions;
   a hollow pillar-shaped sidewall insulating film provided on the inner sidewall of the first opening, having a thickness, perpendicular with respect to the substrate greater than that of the first interlayer insulating film;
   a first conductive film provided on the surface of the sidewall insulating film, on one of the diffusion regions exposed to the inside of the first opening, and on the surface of the first interlayer insulating film in proximity to the sidewall insulating film;
   a capacitor insulating film on the first conductive film;
   a second conductive film on the capacitor insulating film;
   a second interlayer insulating film provided on the substrate surface;
   a second opening provided penetrating the first and second interlayer insulating films, exposing the other one of the diffusion regions;
   an electrode provided in the second opening, being connected to the other one of the diffusion regions, and extending on the surface of the second interlayer insulating film; and
   a second sidewall insulating film on the outer circumference of the sidewall insulating film.

5. A semiconductor memory device, comprising:
   a first conductive-type semiconductor substrate;
   a pair of second conductive-type diffusion regions provided on the substrate surface;
   a gate insulating film provided on the substrate surface and between the pair of diffusion regions;
   a gate electrode on the gate insulating film;
   a first interlayer insulating film on the substrate surface;

a first opening provided in the interlayer insulating film, exposing one of the diffusion regions;

a hollow pillar-shaped sidewall insulating film provided on the inner sidewall of the first opening, having a thickness, perpendicular with respect to the substrate greater than that of the first interlayer insulating film;

a first conductive film provided on the surface of the sidewall insulating film, on one of the diffusion regions exposed to the inside of the first opening, and on the surface of the first interlayer insulating film in proximity to the sidewall insulating film;

a capacitor insulating film on the first conductive film, wherein said capacitor insulating film includes two layers of silicon oxide and silicon nitride;

a second conductive film on the capacitor insulating film;

a second interlayer insulating film provided on the substrate surface;

a second opening provided penetrating the first and second interlayer insulating films, exposing the other one of the diffusion regions; and an electrode provided in the second opening, being connected to the other one of the diffusion regions, and extending on the surface of the second interlayer insulating film.

6. The device of claim 5, wherein said semiconductor substrate includes monocrystalline silicon, said gate electrode includes polycrystalline silicon, said first interlayer insulating film includes glass, and said sidewall insulating film includes silicon nitride.

* * * * *